US011513079B2

(12) United States Patent
Alvis et al.

(10) Patent No.: US 11,513,079 B2
(45) Date of Patent: Nov. 29, 2022

(54) METHOD AND SYSTEM FOR WAFER DEFECT INSPECTION

(71) Applicant: FEI Company, Hillsboro, OR (US)

(72) Inventors: Roger Alvis, Beaverton, OR (US);
John Fretwell, Hillsboro, OR (US);
Laurens Kwakman, Saint Ismier (FR);
Tomas Vystavel, Brno (CZ)

(73) Assignee: FEI Company, Hillsboro, OR (US)

(*) Notice: Subject to any disclaimer, the term of this patent is extended or adjusted under 35 U.S.C. 154(b) by 0 days.

(21) Appl. No.: 17/086,281

(22) Filed: Oct. 30, 2020

(65) Prior Publication Data
US 2022/0113262 A1 Apr. 14, 2022

Related U.S. Application Data

(60) Provisional application No. 63/090,151, filed on Oct. 9, 2020.

(51) Int. Cl.
*G01N 21/95* (2006.01)
*G01N 21/88* (2006.01)
*G06T 7/00* (2017.01)

(52) U.S. Cl.
CPC ..... *G01N 21/9501* (2013.01); *G01N 21/8851* (2013.01); *G06T 7/0004* (2013.01); *G06T 2207/30148* (2013.01)

(58) Field of Classification Search
CPC ............ G01N 21/9501; G01N 21/8851; G06T 7/0004; G06T 2207/30148
See application file for complete search history.

(56) References Cited

U.S. PATENT DOCUMENTS

| 6,566,885 | B1* | 5/2003 | Pinto | H01L 22/34 850/16 |
| 8,948,494 | B2* | 2/2015 | Plihal | G06T 5/50 382/148 |
| 9,739,728 | B1 | 8/2017 | Bedell et al. | |
| 10,082,470 | B2 | 9/2018 | Shortt et al. | |
| 2018/0211378 | A1* | 7/2018 | Bedell | G06T 7/33 |
| 2019/0198287 | A1* | 6/2019 | Vystavel | H01J 37/244 |
| 2020/0211168 | A1* | 7/2020 | Chen | G06T 19/20 |

FOREIGN PATENT DOCUMENTS

CN 1154168 6/2004

OTHER PUBLICATIONS

Schulze et al., "Non-destructive characterization of extended crystalline defects in confined semiconductor device structures," *Nanoscale*, 10:7058-7066 (2018).

* cited by examiner

*Primary Examiner* — Jamil Ahmed
(74) *Attorney, Agent, or Firm* — Klarquist Sparkman, LLP (57) ABSTRACT

Methods for locating and characterizing defects can include performing a first scan of a substrate to produce a first defect map including a first set of coordinates of one or more defects of the substrate and performing a second scan of one or more regions of the substrate associated with the defects based on the first defect map to produce one or more electron channeling contrast (ECC) images of the defects. Characterization of the defects can be based on the ECC images alone or in combination with other techniques. Such methods can include determining a second set of coordinates associated with the one or more defects based on the ECC images and directing an ion beam toward the substrate and milling the substrate based on the second set of coordinates.

19 Claims, 8 Drawing Sheets

METHOD AND SYSTEM FOR WAFER DEFECT INSPECTION

CROSS REFERENCE TO RELATED APPLICATION

This application claims the benefit of U.S. Provisional Application No. 63/090,151, filed Oct. 9, 2020, which is hereby incorporated by reference in its entirety.

FIELD

The disclosure relates to inspecting defects in substrates, and more particularly, relates to inline detection and characterization of wafer defects.

BACKGROUND

Wafer defect inspection systems detect physical defects on the surface and/or within the wafer. The defects may include crystalline defects that are naturally occurring imperfections in the arrangement of a cluster of atoms. Such defects may originate at surfaces, interfaces, or in the body of single-crystal and polycrystalline materials. Defects may be in the form of point, line, or planar defects. These defects can significantly affect the mechanical, electrical, and optical properties of the substrate, greatly impacting performance of the final semiconductor product, especially in products with substrates engineered for specific service environments. As a result, semiconductor manufacturers continuously seek to optimize processes for the detection, localization, and characterization of defects to reduce or eliminate the number of defects in order to ensure product quality and integrity, and to adjust and select device fabrication processes.

Typical wafer defect inspection includes detecting defects based on an optical scan within a first inspection system, relating the defect's position to a fiducial, either an intrinsic feature or an extrinsically created feature, and transporting the fiducial marked wafer to a second inspection system for further inspection. During further inspection, the fiducials and marked defects have to be relocated, for example, by re-detecting the fiducials. This process of relocating defects across inspection systems can be time consuming and prone to errors. Despite the best efforts of the conventional methods, some defects may be invisible with conventional defect detection tools. Even if conventional tools are capable of detecting these defects, these tools and the processes used for locating all or a substantial number of the defects on a full wafer often provide imprecise defect locations, lack sufficient sensitivity, and are both time and process intensive. Improved approaches are needed.

SUMMARY

Methods for locating and characterizing defects comprise performing a first scan of a substrate to produce a first defect map including a first set of coordinates associated with one or more defects of the substrate, performing a second scan of one or more regions of the substrate associated with the defects based on the first defect map to produce one or more electron channeling contrast (ECC) images of the defects, and characterizing the defects based on the ECC images. According to some examples, the first scan has a higher scan rate, higher throughput, and lower resolution than the second scan. The first set of coordinates may be obtained via optical imaging, X-ray diffraction imaging, scanning electron microscopy, or a combination thereof. In representative examples, methods comprise determining a second set of coordinates associated with the one or more defects based on the ECC image. Further defect analysis, including one or more of dispersive X-ray spectroscopy (EDS), backscatter electron (BSE), scanning electron microscopy (SEM) may be performed based on the second set of coordinates. Further, a lamella including the defect may be prepared based on the second set of coordinates for transmission electron microscopy (TEM) and/or scanning transmission electron microscopy (STEM). In further examples, methods comprise characterizing the wafer defects based on EDS maps, the BSE images, the SEM images, the TEM images, the STEM images, or a combination thereof. In this way, wafer defects, including crystalline defects, may be located and characterized inline, during semiconductor manufacturing process, with high sensitivity and reduced inspection time.

The wafer inspection system may comprise an electron source operable to direct an electron beam toward a substrate, and a processor including computer readable instructions, wherein by executing the instructions, the processor is configured to: receive a defect map of the substrate including a first set of coordinates associated with one or more defects of the substrate, direct the electron beam toward the substrate based on the first set of coordinates of the defect map to produce an ECC image of the defects; and characterize the defects based on the ECC image. The wafer inspection system may also be used for acquiring one or more of the EDS, BSE, and SEM signals based on the defect coordinates identified in ECC images. In some examples, the wafer inspection system may also include a focused ion beam (FIB) for milling the substrate.

The foregoing and other objects, features, and advantages of the disclosed technology will become more apparent from the following detailed description, which proceeds with reference to the accompanying figures.

DETAILED DESCRIPTION

The disclosed methods, systems, and apparatus pertain to localization and characterization of defects in substrates such as semiconductor wafers. The defects may include crystalline defects, non-crystalline defects, or a combination thereof. Among them, crystalline defects are commonly found in semiconductor substrates such as epitaxial wafers and are often caused by irregularities in the bare substrate or a mismatch between the crystalline structures of the bare substrate and an epitaxial layer. Crystalline defects in epitaxial wafers include stacking faults and dislocations that can propagate from the bare substrate, through and to the surface of an epilayer. The defects may be located in epitaxial layers and/or substrate/epitaxial layer interfaces of the substrates.

In typical examples, a defect map of the substrate is obtained by a high scan rate and low resolution first scan. The first scan provides initial estimates of locations of defects by surveying large surface areas. The first scan (or survey scan) may be completed in one or more imaging modalities including optical microscopy, X-ray imaging, and SEM. The defect map generated by the first scan includes locations or a first set of coordinates of defects detected during the scan. The defect map may also include an image of the substrate that can be displayed to a technician for location of the defects in the image or a digital or other numerical representation that can be processed to identify defect locations. Multiple defect maps or multiple images in one or more defect maps can be digitally overlaid and/or tiled for the purpose of covering extended areas or correlating across multiple imaging and analysis modalities. In some examples, the defect map includes only location data such as the first set of coordinates of the defects and need not include intensity or other data usually found in an image. In some examples, the defect map may include the crystal orientation information of the defects.

As used herein, substrate refers to processed, unprocessed, patterned, or unpatterned semiconductor substrates such as semiconductor wafers, portions of a wafer on which devices are defined or are to be defined, semiconductor die, or other substrates that exhibit crystalline and/or other types of defects. The first, survey scan is generally configured to permit defect location over substantial portions of a substrate, typically at least 20%, 40%, 50%, 60%, 70%, or 90% of a substrate area in unpatterned wafers, or in some cases highly localized areas of patterned wafers. In patterned wafers, the survey scan may be performed in specific areas, on test structures or product structures, depending on the recipe controlling the survey scan.

A second scan is performed in one or more regions of the substrate associated with the defects based on the defect map. The area of the substrate scanned by the second scan is smaller than the area scanned by the first scan. The second scan has a higher resolution comparing to the first scan. The second scan provides more accurate defect location and additional information for characterizing the defects. In one embodiment, after completing the first scan in a first wafer defect inspection system, the wafer is transferred to a second wafer defect inspection system for the second scan. In another embodiment, the first and second scans are performed on the wafer in a single wafer defect inspection system.

In the examples that follow, ECCI is used for a second or fine scan to improve defect location accuracy. ECCI is sensitive to crystalline defects and allows slight deformations within a crystal lattice structure to be detected and characterized. ECCI can detect deformations which are not typically characterizable with conventional imaging such as X-ray imaging, photoluminescence imaging, or electroluminescence-intensity imaging. ECCI allows for imaging of defects on and extending below the surface of a substrate and is useful with substrates, such as unpatterned wafers and patterned wafers with relatively large open spaces, that lack topographical contrast but have subsurface crystalline defects. Further, ECCI has nanometer lateral resolution that is well suited for imaging defects in patterned epilayers of an epitaxial wafer with nanometer scale dimensions.

ECCI uses intensity of a backscattered electron signal as a function of orientation of a crystal lattice plane of a substrate to observe defects. Typically, the substrate is oriented such that an incident electron beam fulfils or substantially fulfills the Bragg condition with respect to a lattice plane of the substrate. Under such conditions, ECCI can produce changes in backscattered electron current, i.e., changes in electron backscatter signal as the electron beam crosses or scans a defect. These changes in the backscattered electron signal can be used to locate and characterize defects both on and below the surface of a substrate.

ECCI may be performed in regions that include defects identified during the survey scan to relocate the defects. A second set of coordinates of the defects may be generated based on an image produced by ECCI (also referred to as an "ECC image"). The second set of the coordinates may be more accurate than the first set of coordinates. For example, for a particular defect in the defect map generated by the first scan, a nearby region of the defect is imaged by ECCI for searching or relocating the defect. Once the defect is detected in the region, the defect coordinates are recorded in the second set of coordinates. Based on the ECC image, the defect, such as a crystalline defect, can be characterized and/or classified. In one example, EDS signals are acquired simultaneously with the ECCI signals for determining the composition of the materials in the regions. The defect may be characterized based further on the EDS signals.

In some examples, additional analysis is performed in selected regions of the substrate based on the second set of coordinates. For example, the additional analysis is performed in the selected regions to further observe and/or characterize the defect. The additional analysis may be performed using other imaging techniques including one or more of SEM, BSE, EDS, TEM, and STEM scans of the selected regions. In one example, the SEM, BSE, EDS, TEM, and STEM images may be acquired simultaneously (or substantially simultaneously) during a third scan of selected regions. Further, the defects may be imaged or sensed by other techniques including light microscopy, confocal microscopy, fluorescence and luminescence microscopies using laser or other light sources, atomic force microscopy with near-field optical microscopy (NSOM) detection for high-resolution photo luminescence defect localization, X-ray imaging systems, or systems using other type of electromagnetic radiation, with or without applied biases along with detected responses (e.g., electrical-junction analyses such as capacitance versus voltage and electron beam-induced current) to the various stimulations, as well as mass-spectroscopy methods such as atom probe microscopy or time-of-flight secondary ion mass-spectroscopy. The additional analysis may include FIB milling the substrate based on the second set of coordinates to expose the defect for one or more SEM, BSE, and EDS scans. The additional analysis may also include FIB milling the substrate to prepare a lamella for TEM and/or STEM. Because of the higher accuracy of the second set of coordinates compared to the first set of coordinates, data acquisition time for the additional analysis can be reduced.

In other examples, if the defect is not relocated in the second scan, additional analysis may be performed in selected regions of the substrate based on the first set of coordinates. The defect may not be relocated by ECCI if the defect is not a crystalline defect.

In some embodiments, the wafer inspection system includes an electron source for performing ECCI scan, and a focused ion source operable to direct an electron beam and FIB towards the substrate. According to some examples, the system can include a lamella holder and a processor configured to direct the electron beam toward the lamella to produce a TEM and/or STEM image.

As described herein, ECCI and other imaging techniques can provide defect location and characterization. The disclosed systems, methods, and apparatus can be used in conjunction with TEM, STEM, ion beam microscopy, or other charged particle beam applications.

The disclosure relates to locating and characterizing defects near a surface accessible to inspection by techniques using electro-magnetic radiation, for example, visible light, X-rays, and particle beams such as electron beams and ion beams. Further, the systems, methods, and apparatus can be used with single-crystal and polycrystalline metals, insulators, as well as semiconducting alloys, in both bulk and thin-film form-factors. The methods described herein can, for example, operate as a stand-alone method for sample testing to characterize or count defects, and/or as a workflow to relocate defects identified in an upstream analytical system and extract the defect in a dual-beam FIB-SEM system, for additional analysis in a downstream analytical system.

Example 1

Figure 1:
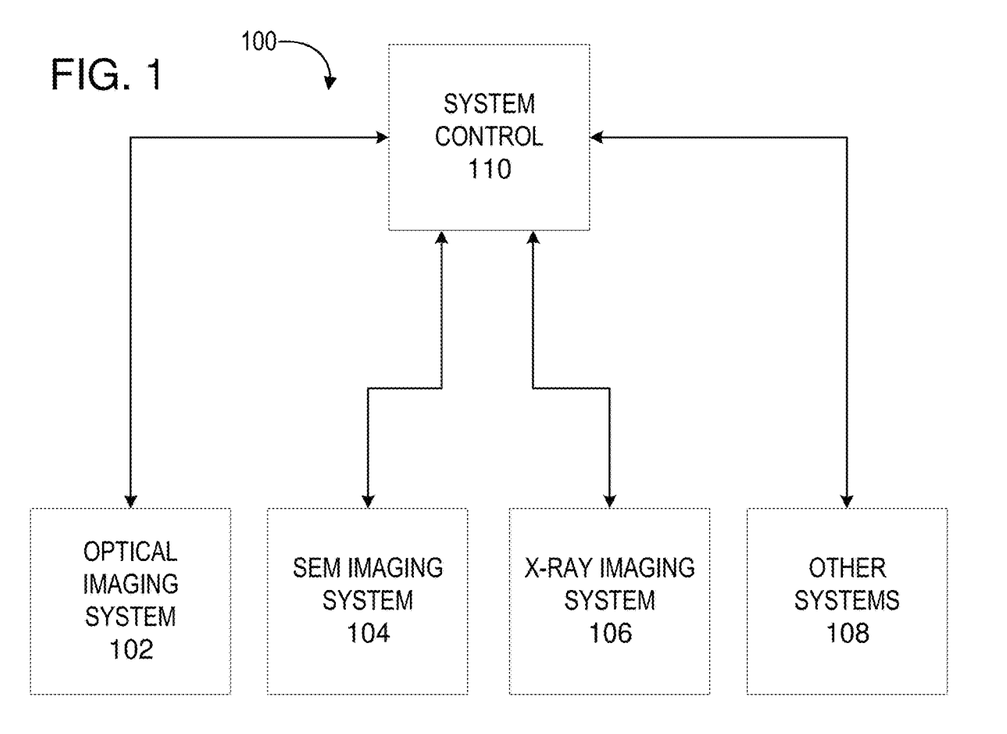
FIG. 1 illustrates a representative defect characterization system that includes optical, X-ray, and scanning electron microscopy (SEM) imaging systems.

As shown in FIG. 1, a representative defect location and characterization system 100 includes one or more of an optical system 102, an X-ray imaging system 106, and SEM imaging system 104, and one or more additional image or evaluation systems 108. A system controller 110 is configured to select, activate, and otherwise regulate any of these imaging or evaluation systems. The system controller 110 can be a single, centralized controller system, or a collection of independent system controllers, such as a system controller for each respective imaging system, coupled for direct communication, or indirect communication via, for example, a fab system host.

The optical imaging system 102 and X-ray imaging system 106 are operable to scan one or more regions of a substrate for defects and produce a defect map or survey of the scanned regions of the substrate. As mentioned above, in a number of examples, a substantially relevant portion of the surface of the substrate is scanned. Optical imaging and/or X-ray imaging can be used individually or in combination to produce corresponding defect maps as different imaging or scanning approaches can reveal or miss different defects. Each of the defect maps produced can, for example, include coordinates specifying the scanned regions of the substrate that include one or more defects. The system controller 110 generally selects one approach for survey scanning but can select multiple approaches. The defect maps generally provide coarse coordinates that can be refined by fine scanning. The coordinates are communicated to the system controller 110. The system controller 110 configures the SEM imaging system 104 for ECCI of regions identified in the defect maps produced by one or both of optical and/or X-ray imaging. If convenient, defect maps obtained with different techniques can be combined so that a single defect map contains all defect locations regardless of survey scan technique. The system controller 110 is coupled to initiate ECCI of the mapped defect locations and the recording of locations at which defects are found and/or enhance location coordinates produced by survey scanning. The enhanced coordinates can be coupled to the system controller 104 and used for other evaluations of defects at the enhanced locations, avoiding time intensive searches for defect locations.

In some examples, the optical imaging system 102 and the X-ray imaging systems 106 are both used to scan the substrate to produce a defect map and the substrate is transferred from one system to another. The substrate can be retained by a substrate carrier for transport between imaging and characterization systems. The substrate carrier, or a sample stage of a respective imaging system, can permit substrates to be repeatably positioned so that defect coordinates, whether coarse or fine, can be used to locate defects in any of the selected systems using predetermined scale factors and offsets among the various imaging and characterization systems. In some examples, one or more of the optical system 102, X-ray imaging system 106, SEM imaging system 104, and additional image or evaluation systems 108 may include respective controllers. Data, including a defect map, generated by one system may be transferred to another system for further defect analysis.

Example 2

Figure 2A:
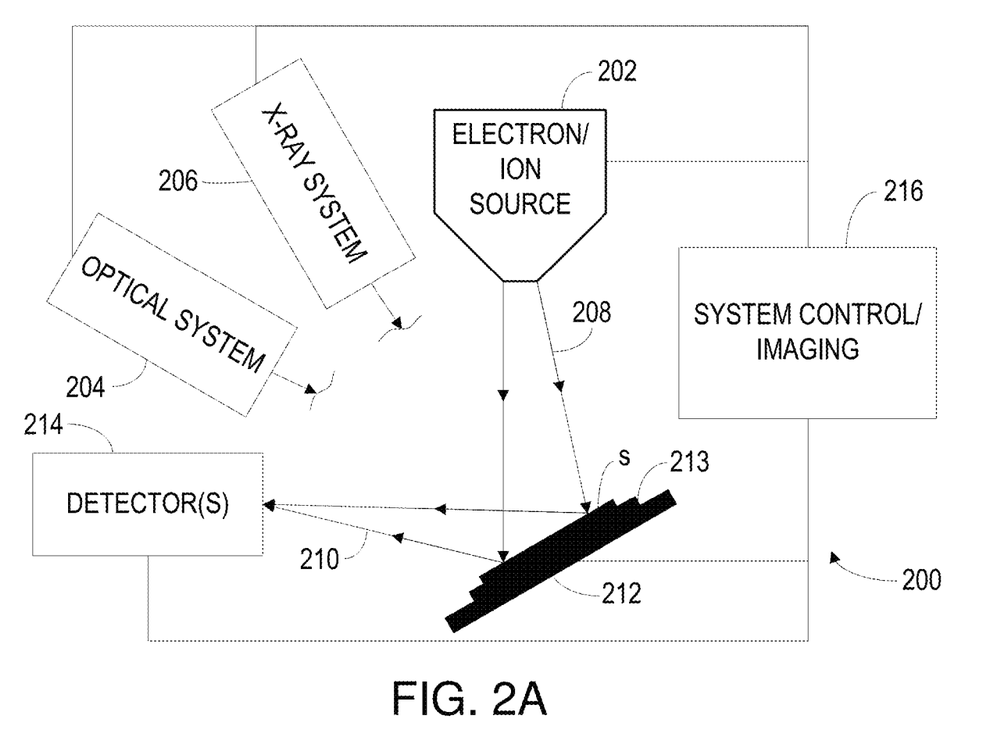
FIG. 2A is a schematic representation of a defect characterization system that includes an electron source and detector configurable for electron channeling contrast imaging (ECCI)

As shown in FIG. 2A, a representative defect location and characterization system 200 includes an optical imaging system 204, an X-ray imaging system 206, and an electron beam column 202 that is operable to produce an electron beam 208. For simplicity of discussion, the defect location and characterization system 200 of FIG. 2A is represented schematically as a single system. However, each of the described imaging systems can be utilized separately from one another and can be in communication via, for example, a central system controller as illustrated in FIG. 1.

The electron beam column 202 can be provided as part of a SEM and/or as part of a dual electron-ion beam system that is operable to produce an electron beam and a FIB. The dual beam system may be configured to transition between operation as an SEM or processing or imaging with the ion beam. For convenient illustration, electron beam and ion beam optical components such as lenses and deflectors are not shown.

The electron beam column 202 is generally equipped with optical elements such as source, electromagnetic, or electrostatic condenser lenses, scanning or deflection coils, and objective lenses to focus the electron beam 208 to selectively scan the surface or a point of the substrate S to produce a backscattered electron beam 210. One or more detectors such as detector 214 are situated to detect radiation responsive to the electron beam 208 such as secondary electrons, backscattered electrons, and emitted X-rays, such as those X-rays emitted during energy-dispersive X-ray spectroscopy (EDS).

Figure 2B:
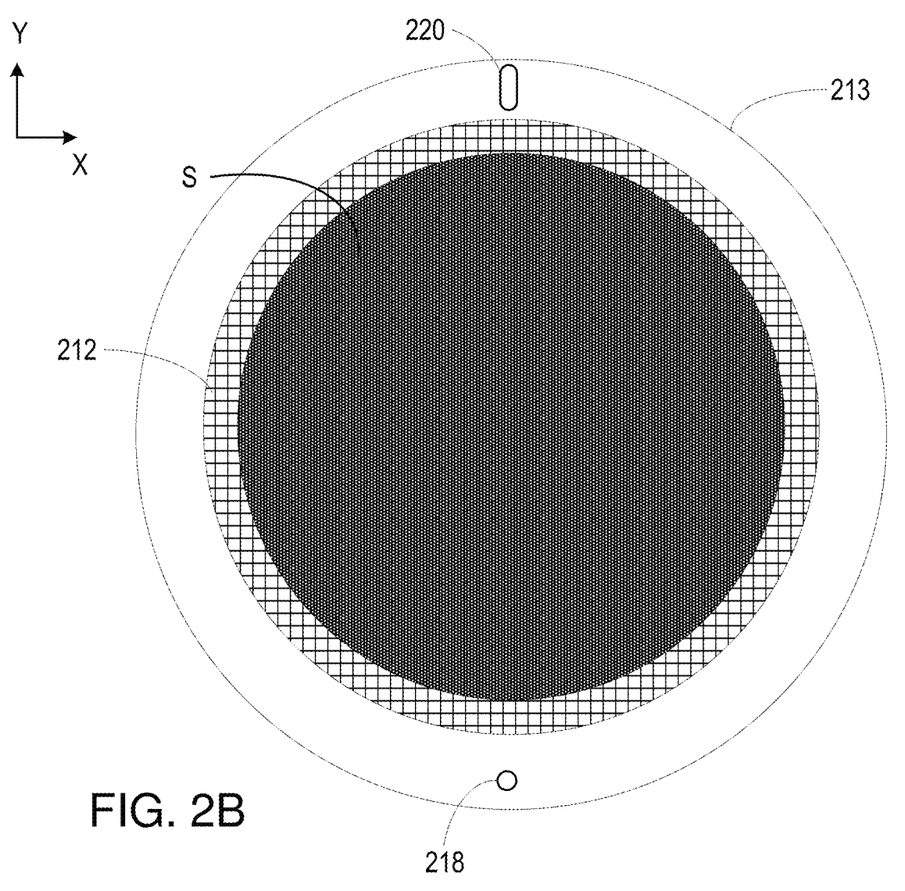
FIG. 2B illustrates a representative substrate carrier that includes fiducials.

The substrate S is secured to a sample stage 212 that permits translation, rotation and tilt adjustments of the substrate S. In some examples, the substrate S is retained on a substrate carrier 213 that is secured to the sample stage 212 and can be used to transfer or translate the substrate between imaging systems. The substrate may be a full wafer. The wafer may have a diameter greater than 100 mm. Referring to FIG. 2B, the substrate carrier includes a first fiducial 218 and a second fiducial 220 that are used to establish (X,Y) coordinates and tilt of the substrate S for imaging or characterization. For example, the first fiducial 218 can be a circular aperture that is registered with a pin to establish (X,Y) coordinates and the second fiducial 220 can be elongate to fit over a pin and control substrate rotation in an XY plane.

In some representative examples, the optical imaging system 204 is configured for bright field (BF) and/or dark field (DF) optical microscopy. In other examples, an optical scatterometer can be provided to assess topographical features of the substrate S via scatterometry techniques. In some examples, the optical radiation system 204 can include one or more light sources such as one or more lasers, LEDS or other sources of optical radiation situated to irradiate the substrate S.

The X-ray imaging system 206 can be used to assess the surface of the substrate S. In some examples, the X-ray imaging system 206 is configured for X-ray diffraction (XRD) for mapping, detecting, and counting defects on the surface of the substrate S.

A system control 216 is also coupled to the electron beam column 202, the optical imaging system 204, and the X-ray imaging system 206. The system controller 216 is configured to establish operating conditions for electron microscopy, such as SEM, as well as for the optical and/or X-ray techniques discussed herein. However, these systems can be separate, stand-alone systems and can be used with a separate SEM/ECCI//FIB system. The system controller 216 is further coupled to the one or more detectors 214 and can produce images based on signals received from the detector 214, such as backscattered electron signals.

Figure 3A:
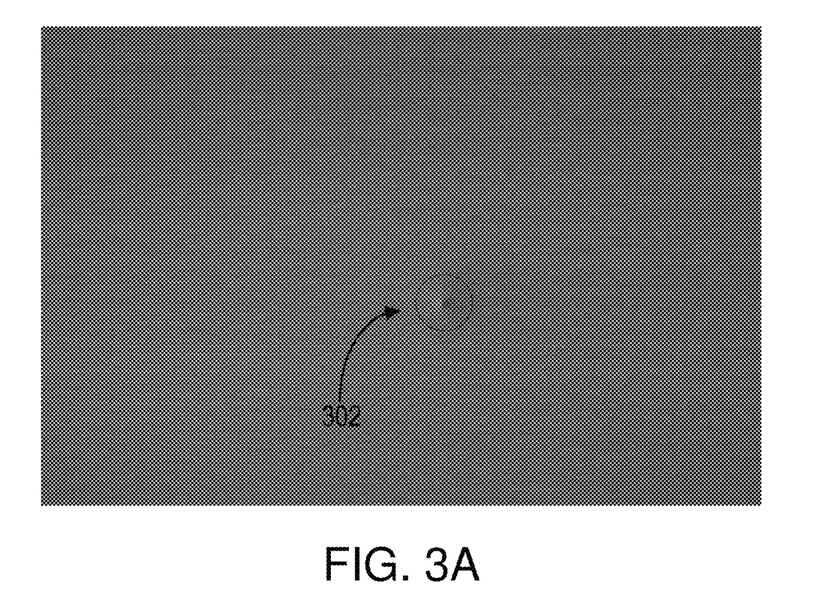
FIGS. 3A-3B illustrate representative images obtained by ECCI of an unpatterned substrate and a patterned substrate, respectively.
Figure 3B:
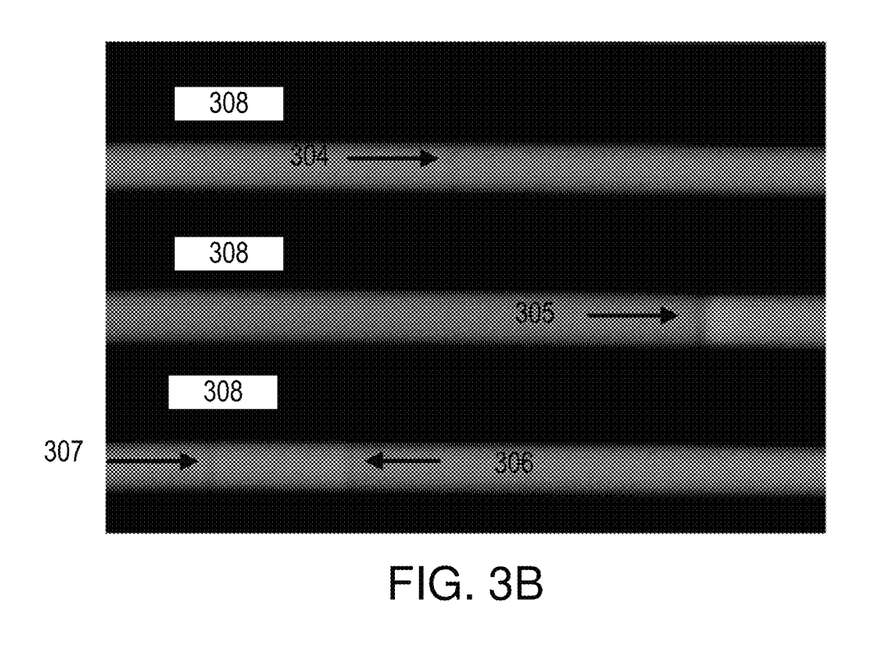

The system 200 can also provide images using ECCI (also referred to as "ECC images") such as shown in FIGS. 3A-3B. Such images can show the presence of crystalline defects in bulk material, including extended surface crystal defects as shown in FIG. 3A. FIG. 3A is from an ECC image of an unpatterned silicon-germanium (SiGe) layer epitaxially grown on a silicon wafer which has a threaded dislocation 302 extending outwardly from its surface. As shown in FIG. 3A, the threaded dislocation 302 appears as a point-like feature exhibiting a visible contrast change, indicating the location of a defect. Similarly, images can also show the presence of crystalline defects in patterned crystalline materials, as shown in FIG. 3B. For example, FIG. 3B is a top view ECC image of a patterned SiGe layer epitaxially grown on a silicon wafer having a contrast change indicating the presence of stacking defects 304-307 below the surface of an epitaxial layer of an SiGe wafer and extending between layers of an amorphous material 308 (e.g., silicon oxide).

Figure 3C:
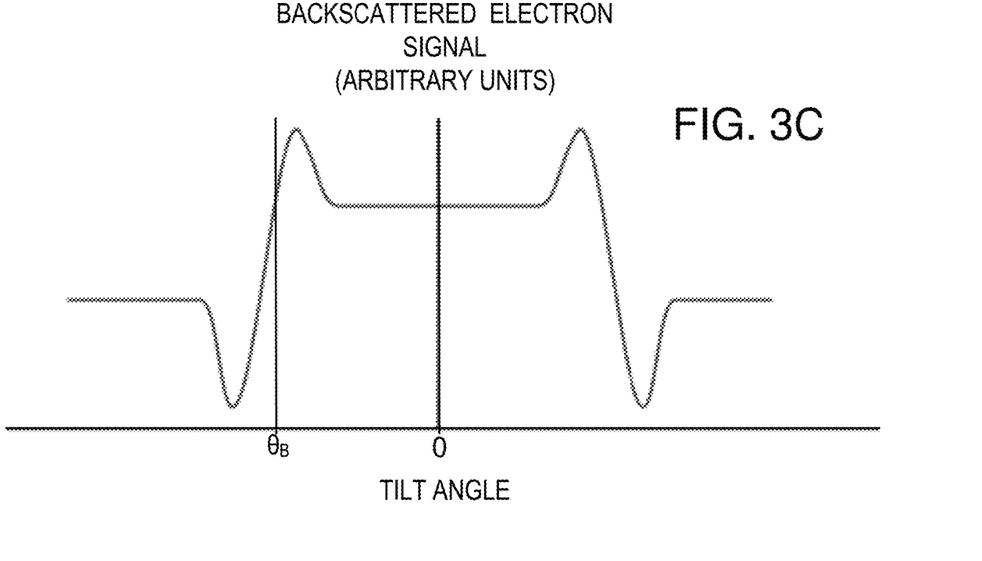
FIG. 3C illustrates backscattered electron signal as a function of tilt angle.
Figure 3D:
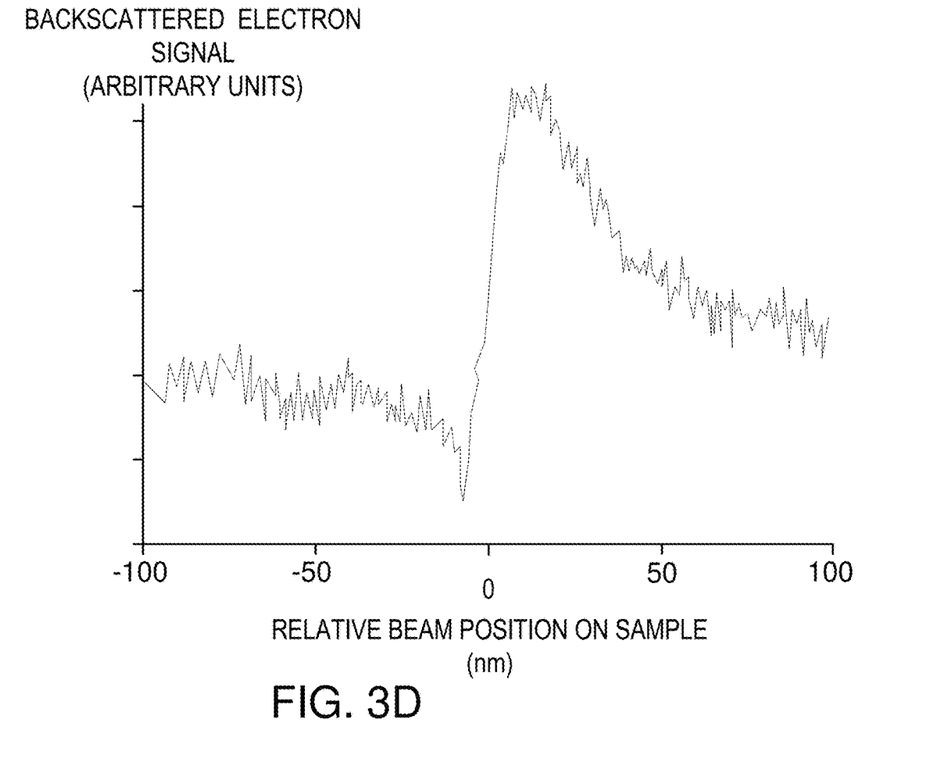
FIG. 3D illustrates a backscattered electron signal as a function of position in a representative electron beam scan through a defect.

The signal intensity changes observed in FIGS. 3A-3B result from changes, or intensity gradients, in the electron backscattered signal as the electron beam crosses the defect when the incident electron beam fulfills the Bragg condition for modulating contrast around the defect responsible for disrupting the crystallinity. For instance, FIG. 3C shows the backscattered electron signal as a function of the tilting angle to crystallographic zone axis as the electron beam crosses the edges of the defect. FIG. 3C shows that backscattered electron signal exhibits a steep change or transition when the Bragg condition is fulfilled (i.e., at $\theta_B$). FIG. 3D depicts normalized intensity of the backscattered electron signal as the electron beam is scanned across a crystalline defect. The observed change in the backscattered electron signal such as illustrated in FIG. 3D, can permit identification of a defect in ECCI. With this approach, atomic-scale displacements in a crystal lattice can be detected when the electron beam and a lattice plane of the substrate are aligned to fulfill the Bragg condition.

Furthermore, backscattered electron signals associated with a particular crystalline defect have one or more features distinct from those associated with other types of defects. In other words, the backscattered electron signals shown in FIGS. 3A-3D differ slightly for different types of defects. For example, backscatter electron signals of different defects can have differing peak intensities, peak widths, slopes of intensity peaks or other features. Crystalline defects, including stacking faults, dislocations, and twin defects, can be characterized by ECCI based on one or more features in the backscattered electron signal. Thus, ECCI allows for locating and characterizing crystalline defects in various substrates without the need for fiducial marking and subsequent scans of the substrate to relocate the fiducial marked defects.

Though an epitaxial SiGe layer on silicon substrate is used as an example, various other thin-film and quantum layer substrates such as gallium antimonide (GaSb), gallium nitride (GaN), silicon carbide (SiC), and various III-V and II/VI compounds or heterostructures can be investigated. Additionally, substrates as discussed herein can include unpatterned and patterned substrates, coated and uncoated substrates, bare wafers, epilayers, and the like, as well as single-crystal and polycrystalline metals and semiconducting alloys, for example, both bulk and thin-film form-factors. For example, representative substrates can be thick substrates that are typically wafers such as silicon or SiC, GaN or sapphire wafers used as starting substrate materials with thin epitaxial films deposited thereon, such as group IV, group III-V or group II-VI compounds (e.g., SiGe, GaAs or InGaAs and CdTe or CdSe) and/or stacks of different thin epitaxial layers (quantum layers, hetero structures). Such representative substrates may be polished to specific planes to provide optimal lattice spacing to induce a desired crystallographic orientation in an epilayer grown thereon.

Example 3

Figure 4:
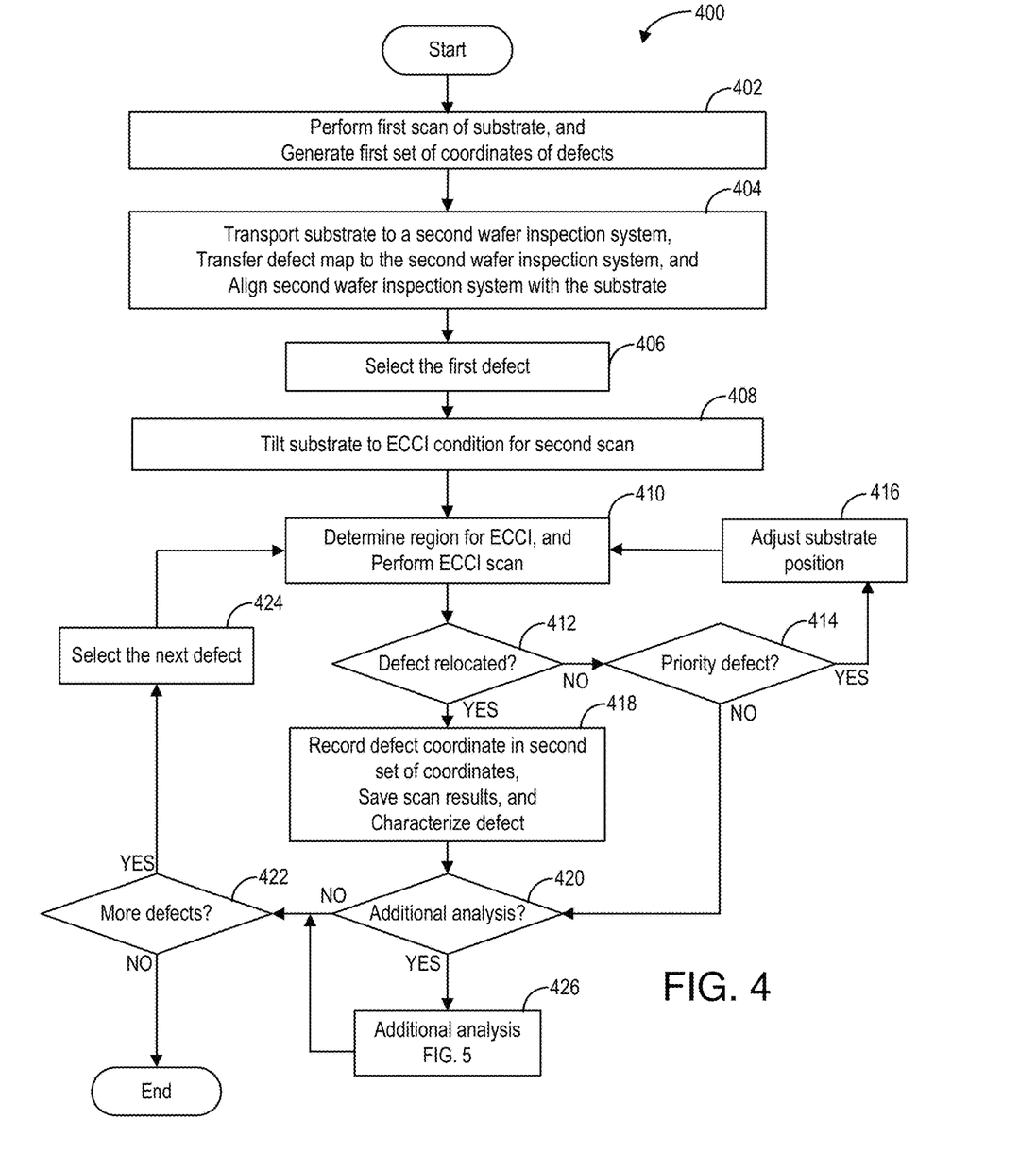
FIG. 4 illustrates a representative method of locating and characterizing a substrate defect.

A representative method 400 for locating and characterizing defects in substrates based on ECCI includes obtaining and/or receiving a defect map of a selected region of a substrate and obtaining a location of at least one defect from the defect map. Typically, the spatial resolution of different imaging techniques, including ECCI, optical, or X-ray imaging varies. In addition, these imaging methods can have different image acquisition times, and the method 400 can use defect maps produced with these techniques or others depending on, for example, a preferred resolution, a time available for imaging, or other considerations. For example, ECCI has relatively high spatial resolution across microscopic and nanoscopic length scales but ECCI at larger scales requires a lengthy image acquisition period. Further, due to different contrast mechanisms, these imaging techniques are sensitive to defects of different types. For example, the optical based techniques may have a lower sensitivity to defects located beneath the surface as compared to X-ray imaging.

At 402, a first scan is performed on the substrate to generate a defect map including a first set of coordinates of defects. The first scan is a high throughput, high scan rate, and low resolution scan of a large area. For example, the entire substrate or substantial portion of the substrate may be scanned during the first scan. The first scan may be achieved by an optical based scan and/or X-ray based scan. The X-ray based scan may be XRD mapping. XRD mapping is capable of rapidly detecting and counting defects on the surface of the substrate and optical imaging is capable of generally locating defects and other particles that are visible and/or scatter light. Crystalline defects such as dislocations or stacking faults have strained or stretched lattice areas. Each of these strains associated with a defect has a direction vector or Burger vector. Burger vectors of line defects may exist in multiple crystallographic directions, defined by the crystal structure of the substrate in a limited number of directions, and may be found lying on one of the allowed crystallographic equivalent planes. For example, defects within an epilayer of an epitaxial substrate meet distinct crystallographic characteristics which define the number of possible orientations of the associated Burger vector. XRD can be used to produce fast, but coarse, defect maps of the substrate. XRD probes one Bragg condition per iteration (or tilt angle). In XRD, the substrate may be oriented to multiple orientations to detect defects within various lattice planes and Burger vectors. ECCI, on the other hand, may allow all of the Bragg conditions of the crystallographic zone axis to be analyzed in one scan.

At 404, if ECCI cannot be performed in the same wafer inspection system for the first scan, the substrate is transported from a first wafer inspection system to a second wafer inspection system for the second scan, wherein the first scan is performed in the first wafer inspection system. In some examples, the substrate is transported between wafer inspection systems via a front-opening unified pod (FOUP). The substrate is removed from the FOUP and placed on a sample stage of the respective wafer inspection system.

The defect map may be transferred from the first wafer inspection system to the second wafer inspection system. Typically, a defect is located based on a relatively high (or low) signal intensity at a particular location. The defect map is generally suitable to indicate locations of one or more defects. Additionally, or alternatively, the defect map in this case can also be a two-dimensional representation of where the identified defects are located on the substrate. A first set of coordinates obtained from the defect map specifies or defines boundaries of regions of the substrate associated with one or more defects. The defect map may include other information, such as defect image and crystal orientation, of the defects. The defect map may include a required tilt angle for ECCI.

In some examples, the first set of coordinates is in the format of a KLA Result File (KLARF), a file type associated with a defect mapping or wafer mapping. Various other file formats and mappings may be used. KLARFs may be used directly in an SEM system configured for ECCI or used to register the coordinates with the SEM system. In some examples, the coordinates associated with one or more particles, residues, smudges, and/or other surface defects imaged during the first scan are appended to the KLARF.

After loading the substrate to the second wafer inspection system, the substrate is aligned with the second wafer inspection system so that substrate locations corresponding to the first set of defect coordinates can be determined. Aligning the substrate with the defect map includes mapping the defect map onto the substrate coordinates in the second wafer inspection system. In one example, the second wafer inspection system is operable to pre-align the substrate such that, for example, the center of the substrate corresponds with an (X,Y) position (e.g., (0,0)) of the sample stage and a defined location at the substrate edge, such as a wafer notch or a wafer flat corresponds to another sample stage position (e.g. (0,-y)). The sample stage in this case, can include an electrostatic and/or a vacuum substrate chuck. In another example, the corners of a die of the substrate serve as known substrate (X,Y) coordinates. In another example, a wafer handler can place a wafer on the wafer stage in a well-defined position. Wafer versus wafer stage coordinate alignment is done based on a wafer prealigner system that rotates the wafer and checks whether the rotation axis and the wafer center match and identifies where a wafer notch is located. Further fine navigation can be done if the wafer has dies already defined on its surface. In yet another example, SEM may be performed on three separate, disconnected regions of the wafer to determine wafer orientation. The wafer may then be aligned with the second wafer inspection system based on the SEM images. For example, the wafer may be aligned by aligning locations of features identified in the SEM images with the defect map.

At 406, the first defect in the defect map is selected. At 408, the substrate is tilted to an ECCI condition for the second scan. In some cases, the tilt angle may be included in the defect map and/or the tilt angle may be different for each defect. In some instances, the tilt angle is determined by XRD at step 402. In comparison to the first scan, the area scanned in the second scan is significantly smaller. For example, the second scan covers less than 1% of the substrate surface area. In another example, the substrate tilt angle for ECCI condition may be determined based on the crystal orientation of the substrate. The crystal orientation may be measured by electron backscatter diffraction (EBSD) or electron channel pattern (ECP) measurement of the substrate. In one example, the crystal orientation of the substrate is measured at one or more defect locations, and the substrate is tilted based on the crystal orientation at each defect location. In another example, multiple defects are scanned by ECCI with the same substrate tilt.

At 410, the region scanned for relocating the selected defect is determined. ECCI is performed in the region for relocating the defect identified in the first scan. Other signals, such as SE, EDS, EBSD signals may be acquired simultaneously (or nearly simultaneously) during the ECCI scan. The composition of the scanned region may be analyzed based on the EDS signal. In one example, the region is determined based on the defect map. In another example, the region is determined based on a previous ECCI scan.

At 412, if the defect is relocated in the ECC image, the defect location is recorded as the second set of coordinates at 418. Similar to the first set of coordinates, the second set of coordinates specify the region and/or boundary corresponding to the identified defect. In some examples, multiple defects may be identified in the ECC image, and the location of those defects saved in the second set of coordinates. The second set of coordinates may be saved by updating the defect map, or in a second, new defect map. Results from the second scan may also be saved. The scan results may include one or more of an ECC image and/or an EDS map. Further, based on the ECC image and EDS map, step 412 may further include characterizing the relocated defect based on various signals acquired at 410. If the defect is not relocated at 412, method 400 moves to 414.

At 414, method 400 determines whether the current defect is a priority defect. Defect priority may be defined by the operator based on one or more of specific applications, substrate type, and location of the defect. Further, the defect priority may be determined based on the initial defect characterization based on an ECC image and/or an EDS image. If the defect being inspected is a priority defect, the substrate position is adjusted at 416 for an additional ECCI scan. If not, method 400 moves to 420. Method 400 may also move to 420 if the defect cannot be relocated after multiple ECCI scans.

Adjusting the substrate position at 416 includes tilting and/or translating the substrate. In one example, the substrate may be tilted to a new tilt angle for ECCI imaging at another crystal orientation. In another example, the sample may be translated to relocate the defect in a larger region. The substrate may be tilted and tiled or spirally scanned to enlarge the ECCI scan area to relocate the priority defect previously not located in the initial or prior scans. Step 416 may also include updating the region or field of view for ECCI scan.

At 420, method 400 determines whether additional analysis is needed. Additional analysis may be needed for a priority defect or for identifying the root cause of the defect. Additional analysis may be performed based on the second set of coordinates to further characterize and classify the defect. In comparison to the first set of coordinates generated from the first scan, the second set of coordinates is more accurate. In some examples, if the defect cannot be relocated in the second scan, additional analysis may be performed based on the first set of coordinates. If additional analysis is needed, method 400 moves to 426 to perform additional imaging (i.e., scanning) of the current defect. Details of the additional analysis are presented in FIG. 5. After analysis of the defect at 426, method 400 moves on to 422. If additional analysis is not needed at 420, method 400 at 422 determines whether one or more defects in the defect map are to be inspected. If the defect currently being inspected is not the last defect, the next defect is selected at 424, and ECCI is performed to relocate the next defect at 410. If the defect being inspected is the final defect, method 400 terminates. In some examples, additional analysis may be performed at 426 after scanning multiple or all of the defects of the substrate.

The method 400 and other methods discussed herein can obtain a location of a defect from a selected region of the substrate without marking the defect with a fiducial and/or referencing a fiducial mark to relocate the defect. While fiducial markings could be used, they are not needed. Note also that particles, residues, smudges, or the like can be used to locate defect regions.

Example 4

Figure 5:
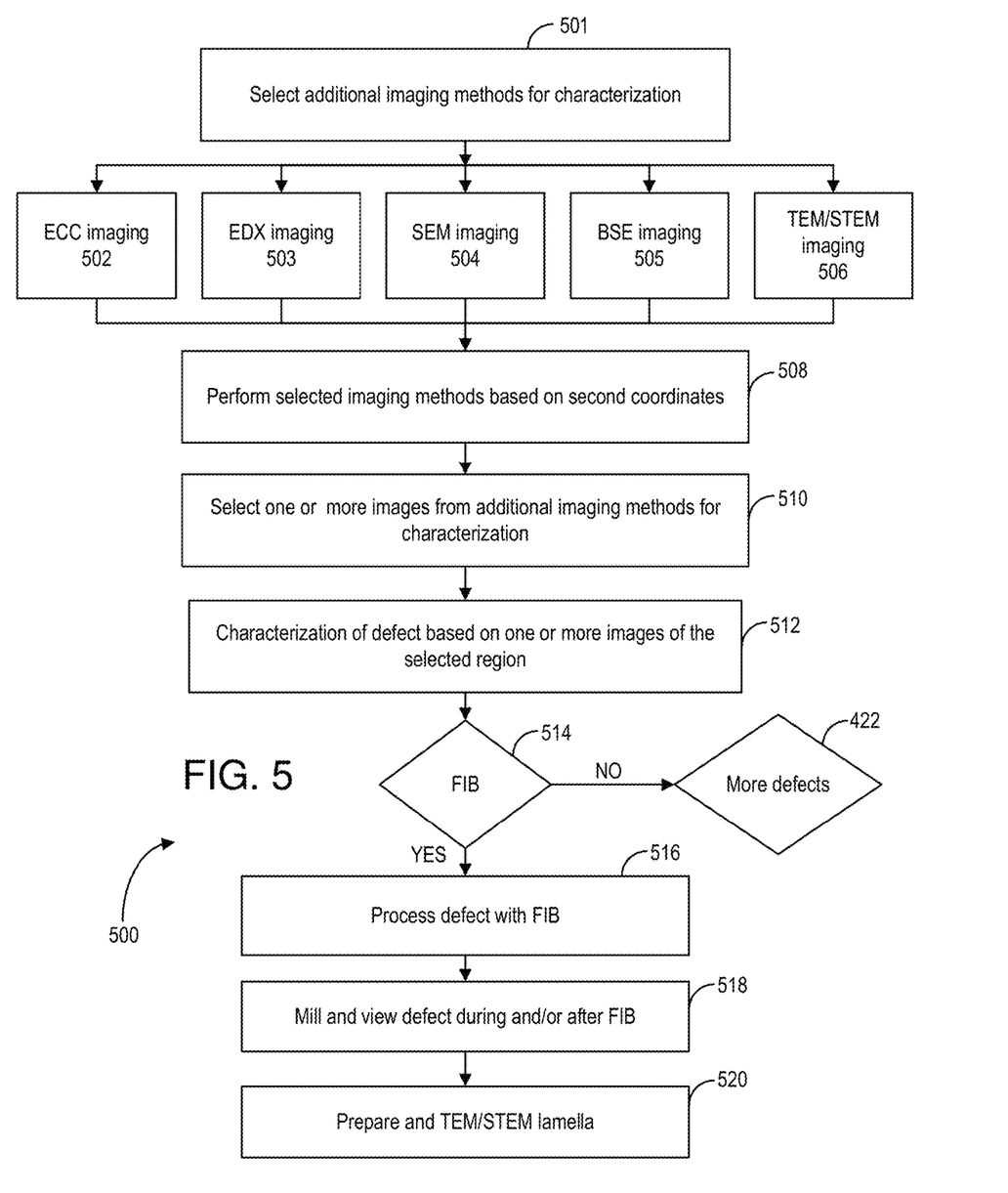
FIG. 5 illustrates a representative method of characterizing a substrate defect.

As described above, one or more crystalline defects are located by ECCI and characterized based on a contrast in a backscattered electron signal from ECCI the selected region. In a method 500 (e.g., 426 of FIG. 4), in addition to ECCI, at 501 one or more imaging methods are also selected for characterization of the defect. In the example of FIG. 5, a selected method such as EDS, SEM, BSE, TEM and/or STEM, is performed before, after, or in conjunction with ECCI at one or more of 503-506, respectively. The images provided by any of these techniques at 503-506 can be used to further characterize defects, identify particles, or provide other information about the substrate. For example, EDS imaging at 503 can provide elemental analysis and/or chemical characterization, SEM imaging at 504 can provide topographical and compositional analysis, and BSE imaging at 505 and/or TEM/STEM imaging at 506 can provide additional high-resolution images that show the elemental makeup and fine details of the substrate. Though crystalline defects are located via ECCI, in some examples, non-crystalline, or visible defects, such as topographical defects and/or defects on the surface of the substrate are located via EDS, SEM, BSE, and/or TEM/STEM techniques. For example, the performed EDS, SEM, BSE, and/or TEM/STEM may be used to identify and group defects as visible defects. In some cases, such representative techniques can be used to locate or identify invisible defects.

Once a crystalline defect is located via an ECC image at 508, one or more of the images produced by EDS, SEM, BSE, or TEM/STEM are selected for defect characterization at 510. In some examples, images produced by the above methods are selected to characterize visible defects, i.e., non-crystalline defects while ECCI is used to characterize crystalline defects, or invisible defects, such as those below the substrate surface.

At 512, for each image produced from the above imaging techniques, further defect features from the respective image can be compared to a predetermined library of features associated with one or more known types of defects for characterization. For example, the table below provides a representative listing of features or criteria that can be associated with various types of defects and/or particles (e.g., residue, smudge, etc.) that may be observable (e.g., defects on and/or below the surface of the substrate). For instance, the far-left column lists the selected imaging methods while each column to the right lists a known type of defect, or particle, and a value underneath indicating whether a defect feature or signal from the corresponding image satisfies the predetermined criteria. Observable defects and particles in this case can include foreign particles, such as those possibly identified from optical imaging, substrate particles, surface residue, crystal originated particles (COP), and/or crystalline defects.

Characterization can be based on binary logic, such as "True/False" corresponding to features present in a particular image. A "True" value for example, can correspond to a "strong" signal while a "False" value corresponds to a "weak" signal. For example, a strong signal from ECCI can correspond to an observed change in the backscattered electron signal, whereas no change can correspond to a "weak" signal. An observed change in the backscattered electron scatter then would indicate that the defect from an ECC image is a crystalline defect and can be assigned a "True" value as shown in the below. Further examples can include assigning "strong" or "weak" signals to emission signals from an EDS image, topographical features from SEM, or other identifiable features associated with a type of defect or particle. Values assigned as strong or weak can be adjusted based on test images or otherwise, and changes in which imaging signals (such as backscattered electron signals) can be increases or decreases. Imaging signals as a function of position can be compare with reference signals associated with different types and categories of defects or other substrate properties. Correlation or other pattern matching approaches can be used.

| Characterization Table | | | | | |
|---|---|---|---|---|---|
| Method | Foreign Particle | Particle Wafer | Surface Residue | COP | Crystal |
| SE | True | True | False | True | False |
| BSE | True | False | False | False | False |
| EDS | True | False | False | False | False |
| ECCI | False | False | False | False | Strong |

In a like manner, the criteria in the table above can be used to further characterize or provide an initial classification of the defect. For example, the defect from an ECC image of the immediate above example can have a unique transition peak, or feature, that is indicative of a threaded dislocation (e.g., dislocation shown in FIG. 2A).

Though a binary logic is used as representative example, any logic or system that can characterize and/or compare the defect features from any one of the images produced from the methods discussed above, to features of one or more known defect types can be used. Furthermore, any characterization of the defects observed by the methods above can then be used to prioritize the defects further processes, such as imaging and/or analyses.

Once located and characterized, at 514 it may be determined that one or more additional defects in the defect map are to be inspected (e.g., at 422) at which point the next defect is selected and ECCI is performed to relocate the next defect (e.g., at 422 and 424 of FIG. 4). In lieu of further inspection, however, at 514 the located and characterized defects of method 500 can be prepared by using a FIB for further analysis and higher magnification imaging, such as TEM, SEM, and/or further ECCI at other orientations. For example, at 516-520, a FIB can be used to prepare cross-sectional or plan view TEM lamellae for use in analysis and to determine a final classification of the defect using TEM. Preparing the lamella can include milling the substrate to include a selected defect and analyzing the lamella can include imaging the lamella and characterizing the selected defect based on lamella image. In this manner, method 500 can be used in conjunction with the method 400 and/or represent a final step in substrate inspection.

In some examples, the ECCI coordinates (that is, the second set of coordinates) can be used to adjust a stage or direct the FIB to prepare a lamella including at least a portion of the defect. In this manner, FIB preparation of the lamella can be provided shortly after the defect is located and characterized, without translation of the substrate or realignment of process tools. Alternatively, the defect may be marked by the FIB in instances where the substrate is used in one or more parallel, complimentary, and/or alternative methods.

Example 5

Figure 6:
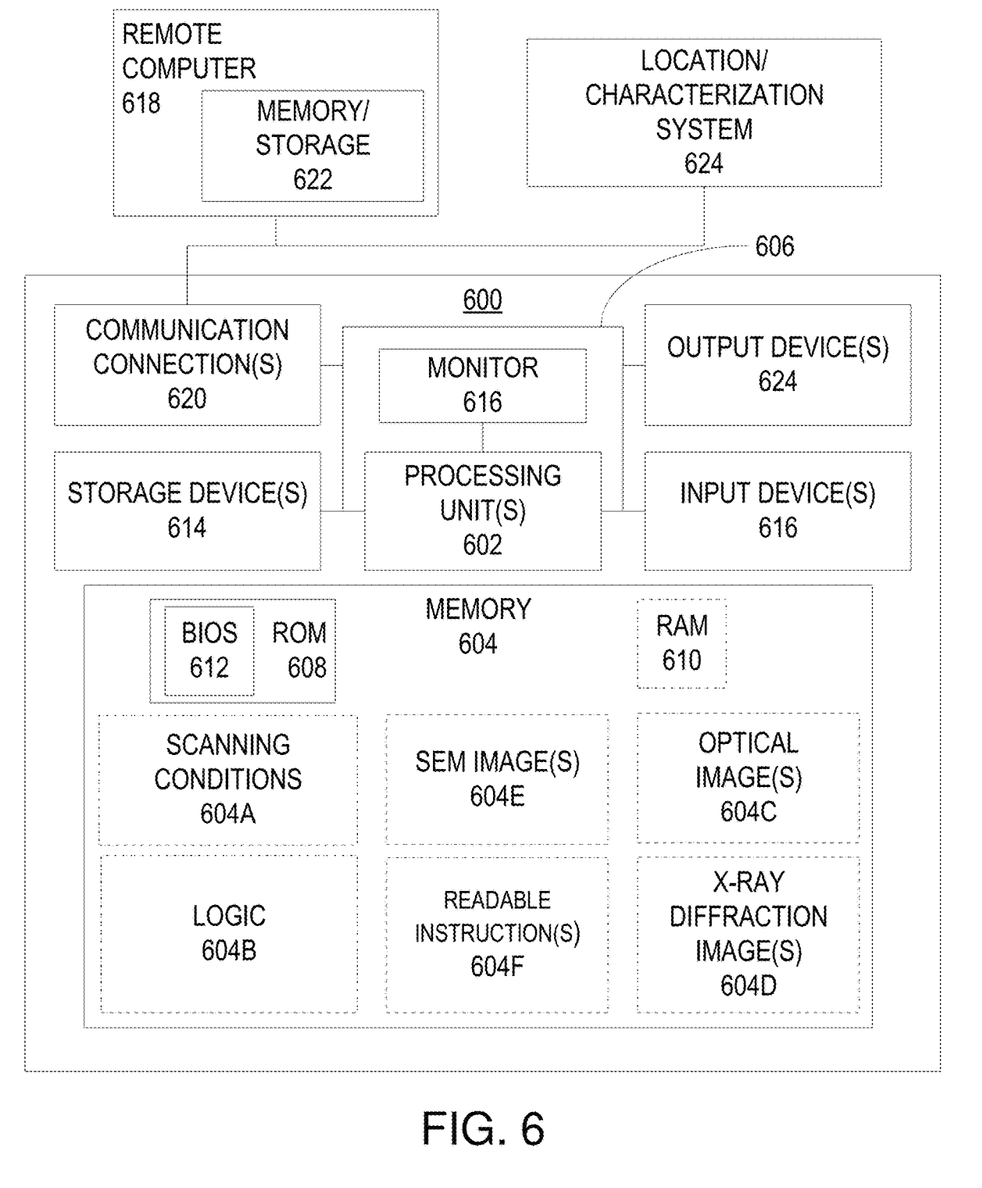
FIG. 6 illustrates a representative computing environment for performing the disclosed methods.

FIG. 6 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including handheld devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 6, an exemplary system for implementing the disclosed technology includes a general purpose computing device in the form of an exemplary conventional PC 600, including one or more processing units 602, a system memory 6-4, and a system bus 606 that couples various system components including the system memory 604 to the one or more processing units 602. The system bus 606 may be any of several types of bus structures including a memory bus or memory controller, a peripheral bus, and a local bus using any of a variety of bus architectures. The exemplary system memory 604 includes read only memory (ROM) 608 and random-access memory (RAM) 610. A basic input/output system (BIOS) 612, containing the basic routines that help with the transfer of information between elements within the PC 600, is stored in ROM 608.

The exemplary PC 600 further includes one or more storage devices 614 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 606 by a hard disk drive interface, a magnetic disk drive interface, and an optical drive interface, respectively. The drives and their associated computer readable media provide nonvolatile storage of computer-readable instructions, data structures, program modules, and other data for the PC 600. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 614 including an operating system, one or more application programs, other program modules, and program data. A user may enter commands and information into the PC 600 through one or more input devices 616 such as a keyboard and a pointing device such as a mouse. Other input devices may include a digital camera, microphone, joystick, game pad, satellite dish, scanner, or the like. These and other input devices are often connected to the one or more processing units 602 through a serial port interface that is coupled to the system bus 606, but may be connected by other interfaces such as a parallel port, game port, or universal serial bus (USB). A monitor 616 or other type of display device is also connected to the system bus 606 via an interface, such as a video adapter. Other peripheral output devices 624, such as speakers and printers (not shown), may be included.

The PC 600 may operate in a networked environment using logical connections to one or more remote computers, such as a remote computer 618. In some examples, one or more network or communication connections 620 are included. The remote computer 618 may be another PC, a server, a router, a network PC, or a peer device or other common network node, and typically includes many or all of the elements described above relative to the PC 600, although only a memory storage device 622 has been illustrated in FIG. 6. The PC 600 and/or the remote computer 618 can be connected to a logical a local area network (LAN) and a wide area network (WAN). Such networking environments are commonplace in offices, enterprise wide computer networks, intranets, and the Internet.

When used in a LAN networking environment, the PC 600 is connected to the LAN through a network interface. When used in a WAN networking environment, the PC 600 typically includes a modem or other means for establishing communications over the WAN, such as the Internet. In a networked environment, program modules depicted relative to the PC 600, or portions thereof, may be stored in the remote memory storage device or other locations on the LAN or WAN. The network connections shown are exemplary, and other means of establishing a communications link between the computers may be used.

The PC 600 is coupled to communicate with a location and characterization system and/or control the system. The memory 604 can include a memory portion 604A that stores scanning conditions that include imaging protocols, a memory portion 604B that provides characterization logic, a memory portion 604C that stores optical images and coordinates, a memory portion 604D that stores XRD images and coordinates, a memory portion 604E that stores SE, BSE, ECC, and EDS images and coordinates, as well as other integrated modalities relevant to defect relocation and characterization, and a memory portion 604G that includes computer-executable instructions for aligning coordinates, obtaining locations, and comparing characterization features.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation. As used herein, thermal contact does not require a direct physical contact but only a thermally conductive path.

In view of the many possible embodiments to which the principles of the disclosed technology may be applied, it should be recognized that the illustrated embodiments are only preferred examples and should not be taken as limiting the scope of the disclosure. We therefore claim all that comes within the scope and spirit of the appended claims.

We claim:

1. A method, comprising:
   performing a first scan of a substrate to produce a first defect map including a first set of coordinates associated with a plurality of defects of the substrate;
   tilting the substrate to an electron channeling contrast imaging condition;
   performing a second scan of one or more regions of the substrate determined based on the first set of coordinates of the first defect map to produce a plurality of electron channeling contrast (ECC) images of the defects;
   acquiring energy dispersive X-ray spectroscopy (EDS) signals while acquiring the ECC images; and
   characterizing the defects based on the ECC images and EDS signals.

2. The method of claim 1, wherein the substrate is a full wafer.

3. The method of claim 1, wherein a scan rate of the first scan is greater than a scan rate of the second scan.

4. The method of claim 1, wherein the first scan is obtained via optical imaging, X-ray diffraction imaging, scanning electron microscopy (SEM), or a combination thereof.

5. The method of claim 1, wherein the second scan has a higher spatial resolution than the first scan.

6. The method of claim 1, the method further comprising:
   determining a second set of coordinates associated with the one or more defects based on the ECC image;
   performing a third scan of a selected region of the substrate based on the second set of coordinates; and
   characterizing defects within the selected region based on the ECC image and signals acquired during the third scan.

7. The method of claim 6, wherein the third scan is based on energy dispersive X-ray spectroscopy (EDS), backscatter electron (BSE), scanning electron microscopy (SEM), or a combination thereof.

8. The method of claim 1, the method further comprising:
   determining a second set of coordinates associated with the one or more defects based on the ECC image; and
   directing an ion beam toward the substrate and milling the substrate based on the second set of coordinates.

9. The method of claim 8, further comprising:
   preparing a lamella to include a selected defect by milling the substrate;
   imaging the lamella; and
   characterizing the selected defect based on the lamella image.

10. The method of claim 1, wherein the defects comprise crystal defects, non-crystal defects, or a combination thereof.

11. A system, comprising:
    an electron source operable to direct an electron beam toward a substrate; and
    a processor including computer-readable instructions, wherein by executing the instructions, the processor is configured to:
    load the substrate into the system;
    receive a defect map of the substrate including a first set of coordinates associated with a plurality of defects of the substrate;
    tilt the substrate to an electron channeling contrast imaging condition;

direct the electron beam toward the substrate based on the first set of coordinates of the defect map to produce a plurality of electron channeling contrast (ECC) images of the plurality of defects;

acquire energy dispersive X-ray spectroscopy (EDS) signals while acquiring the ECC images; and characterize the plurality of defects based on the ECC images and EDS signals.

12. The system of claim 11, wherein the defect map is generated before loading the substrate into the system, and the processor is further configured to:

align the substrate with the system;

determine a crystal orientation of the substrate; and tilt the substrate based on the crystal orientation before acquiring the ECC image.

13. The system of claim 11, wherein the processor is further configured to:

determine a second set of coordinates associated with the one or more defects of the substrate based on the ECC image;

direct the electron beam toward the substrate based on the second set of coordinates to produce one or more of an EDS image, a SEM image, a BSE image, a TEM image, and a STEM image; and characterize the defects based on one or more of the ECC image, the EDS image, the SEM image, the BSE image, the TEM image, and the STEM image.

14. The system of claim 11, further comprising a focused ion source operable to direct a focused ion beam (FIB), wherein the processor is further configured to:

determine a second set of coordinates associated with the one or more defects of the substrate based on the ECC image; and direct the FIB toward selected regions of the substrate based on the second set of coordinates to prepare a lamella containing one or more defects.

15. The system of claim 14, further comprising a lamella holder, wherein the processor is further configured to:

direct the electron beam toward the lamella to produce a STEM image; and characterize one or more defects based further on the STEM image.

16. A method, comprising:

receiving a first set of coordinates associated with a plurality of defects of a substrate, wherein the first set of coordinates is obtained from a survey scan of the substrate having a resolution;

tilting the substrate to an electron channeling contrast imaging condition;

acquiring a plurality of ECC images of one or more regions of the substrate determined based on the first set of coordinates;

acquiring energy dispersive X-ray spectroscopy (EDS) signals while acquiring the ECC images; and characterizing the one or more defects based on the ECC images and EDS signals.

17. The method of claim 16, further comprising:

determining a second set of defect coordinates associated with locations of the one or more defects from the ECC image;

acquiring signals from the one or more defects by scanning the substrate based on the second set of defect coordinates; and characterizing the one or more defects based further on the acquired signals.

18. The method of claim 17, further comprising extracting features of the defects based on the ECC image and the acquired signals, and wherein characterizing the one or more defects includes comparing the features of the defects with a library of stored defect features.

19. The method of claim 16, further comprising:

determining a second set of defect coordinates associated with locations of the one or more defects from the ECC image; and directing a FIB to the location of a selected defect based on the second set of coordinates to prepare a lamella containing the selected defect.

\* \* \* \* \*